United States Patent
Nalla et al.

(10) Patent No.: US 8,431,438 B2
(45) Date of Patent: *Apr. 30, 2013

(54) FORMING IN-SITU MICRO-FEATURE STRUCTURES WITH CORELESS PACKAGES

(75) Inventors: Ravi K Nalla, Chandler, AZ (US); Mathew J Manusharow, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 345 days.

This patent is subject to a terminal disclaimer.

(21) Appl. No.: 12/755,183

(22) Filed: Apr. 6, 2010

(65) Prior Publication Data

US 2011/0241195 A1    Oct. 6, 2011

(51) Int. Cl.
    *H01L 21/00*    (2006.01)
(52) U.S. Cl.
    USPC ........... 438/110; 438/113; 438/117; 438/127; 257/E23.048; 257/E23.055; 257/E23.067; 257/E27.046; 257/E29.324
(58) Field of Classification Search .......... 438/110–127; 257/21.499–508, 705
    See application file for complete search history.

(56) References Cited

U.S. PATENT DOCUMENTS

| | | | | |
|---|---|---|---|---|
| 5,045,921 A | * | 9/1991 | Lin et al. | 257/680 |
| 5,072,283 A | * | 12/1991 | Bolger | 257/676 |
| 5,151,769 A | * | 9/1992 | Immorlica et al. | 257/659 |
| 5,861,670 A | * | 1/1999 | Akasaki | 257/737 |
| 6,617,680 B2 | * | 9/2003 | Chien-Chih et al. | 257/698 |
| 7,091,581 B1 | * | 8/2006 | McLellan et al. | 257/673 |
| 7,262,444 B2 | * | 8/2007 | Fillion et al. | 257/177 |
| 7,411,289 B1 | * | 8/2008 | McLellan et al. | 257/700 |
| 7,750,452 B2 | * | 7/2010 | Do et al. | 257/686 |
| 2004/0072389 A1 | * | 4/2004 | Chen et al. | 438/127 |
| 2008/0224293 A1 | * | 9/2008 | Hin | 257/685 |
| 2009/0072382 A1 | | 3/2009 | Guzek | |
| 2011/0121413 A1 | * | 5/2011 | Allen et al. | 257/416 |
| 2011/0215464 A1 | * | 9/2011 | Guzek et al. | 257/737 |
| 2011/0241186 A1 | * | 10/2011 | Nalla et al. | 257/659 |
| 2011/0254124 A1 | * | 10/2011 | Nalla et al. | 257/531 |

* cited by examiner

*Primary Examiner* — Michael Lebentritt
(74) *Attorney, Agent, or Firm* — Winkle, PLLC

(57) ABSTRACT

Methods of forming a microelectronic packaging structure and associated structures formed thereby are described. Those methods may include attaching a die to a carrier material, forming dielectric material surrounding the die, forming buildup layers in the dielectric material to form a coreless bumpless buildup package structure, and patterning the carrier material to form microchannel structures on the package structure.

13 Claims, 6 Drawing Sheets

FORMING IN-SITU MICRO-FEATURE STRUCTURES WITH CORELESS PACKAGES

BACKGROUND OF THE INVENTION

As semiconductor technology advances for higher processor performance, advances in packaging architectures may include coreless bumpless build-up Layer (BBUL-C) package architectures and other such assemblies. Current process flows for BBUL-C packages involve building of the substrate on a temporary core/carrier capped with copper foil, which is etched off after the package is separated from the core. A heat spreader can be attached post-package manufacturing, which adds additional manufacturing cost and time.

BRIEF DESCRIPTION OF THE DRAWINGS

While the specification concludes with claims particularly pointing out and distinctly claiming certain embodiments of the present invention, the advantages of this invention can be more readily ascertained from the following description of the invention when read in conjunction with the accompanying drawings in which:

DETAILED DESCRIPTION OF THE PRESENT INVENTION

Figure 1A:
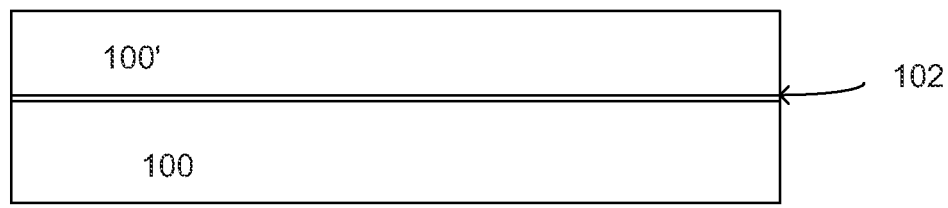
FIGS. 1a-1k represent methods of forming structures according to an embodiment of the present invention.
Figure 1B:
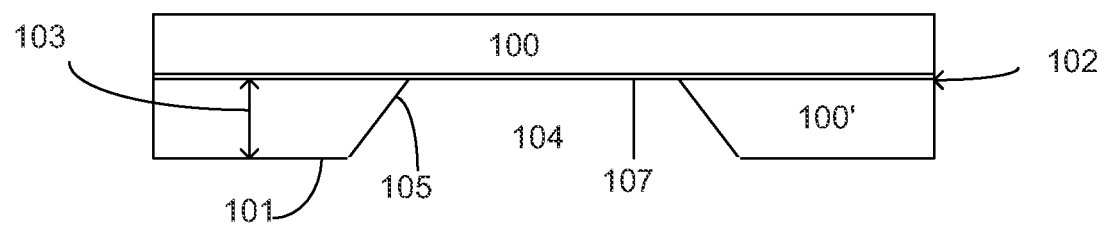

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming and utilizing a microelectronic structure, such as a package structure, are described. Those methods may comprise forming a cavity in a plating material to hold a die, attaching the die in the cavity, forming a dielectric material adjacent to the die, forming vias in the dielectric material adjacent the die, forming interconnects in the vias to form a package structure, and patterning the carrier material to form micro-feature structures on the package structure. Methods of the embodiments enable the patterning of the copper foil on a carrier material to create micro-feature structures that can be used as a very effective heat spreader for applications, for example, wherein the die requires heat dissipation.

FIGS. 1a-1k illustrate embodiments of methods of forming a microelectronic structure, such as a package structure, for example. FIG. 1a illustrates a carrier material 100, 100'. In one embodiment, the carrier material 100 may comprise a multi-layer copper foil that may serve as a carrier, such as a microelectronic die carrier. In an embodiment, the carrier material 100 may comprise two layers, 100, 100' as shown, but may comprise one layer or greater than two layers in other embodiments.

In an embodiment, the carrier material 100 may comprise two layers of a conductive material, such as but not limited to copper, for example, that may be separated by a thin etching barrier (stop) layer 102. In an embodiment, the etch stop layer 102 may comprise such materials as nickel, for example, but may comprise any such material that may serve to comprise an etch stop layer to facilitate the stopping of an etch between carrier layers. In an embodiment, the etch stop layer 102 may serve to aid in the formation of a cavity 104 (FIG. 1b), especially during an etching process, for example. In an embodiment, a thickness 103 of the bottom carrier material layer 100' may be dictated by the thickness and embedded depth of a die to be embedded into the carrier material 100' in a subsequent assembly step.

The cavity 104 may be formed in one layer of the carrier material, such as by removing a portion of the bottom carrier material layer 100'. The cavity 104 may be formed utilizing any suitable removal process, such as an etching process, such as are known in the art. For example, a masking material may be laminated onto the bottom layer of the carrier material 100' and the carrier material 100' may be pattered to form the cavity 104, wherein a die may be subsequently placed therein. The etch stop layer 102 between the carrier material layers 100, 100' may serve as an etch stop for the cavity 104 formation and may define a flat surface to place the die on to. The cavity 104 as formed may comprise a bottom portion 101 an angled portion 105, and a top portion 107, wherein the top portion comprises a portion of the etch stop layer 102.

Figure 1C:
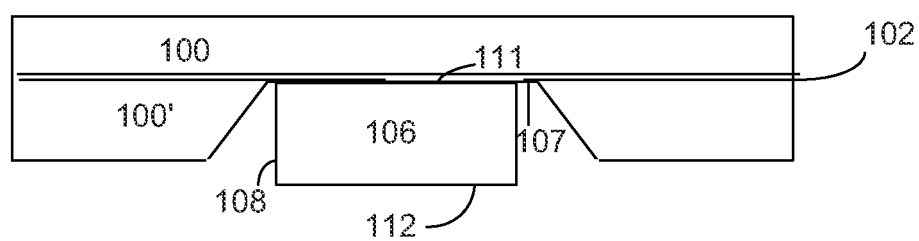

In other embodiments, the cavity 104 may not be formed, and the bottom portion of the carrier material 100 may remain substantially flat, as in FIG. 1a. In an embodiment, a die, such as a microelectronic die 106, for example, may be attached within the cavity 104 (FIG. 1c). In an embodiment, the die 106 may comprise a thin die 106, and may comprise a thickness of below about 150 microns. In an embodiment, the die 106 may be attached to the top portion 107 of the cavity 104. In an embodiment, the die 106 may comprise at least one sidewall 108, a back side 111 and an active side 112. In an embodiment, the back side 111 of the die 106 may be disposed directly on a portion of the etch stop layer 102 within the cavity 104. In some cases, an adhesive film (not shown) and/or an attach process may be used to attach the die 106 into the cavity 104 of the carrier material 100'.

In an embodiment, the adhesive film can be used as a permanent part of a final package to protect the backside 111 of the die 106, to provide a surface for marking, and/or to manage any warpage that may occur within the die 106, for example. In an embodiment, the adhesive may comprise a back-side film (DBF) that may be applied to the back side 111 of the die 106 prior to placement. The DBF may be filled with metallic particles (e.g, copper or silver), for example, to enhance conductivity when subsequently connected to a heat spreader device, such as a micro-feature heat spreader, for example.

Figure 1D:
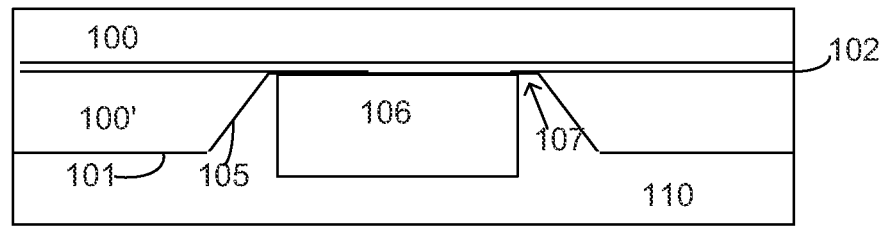
Figure 1E:
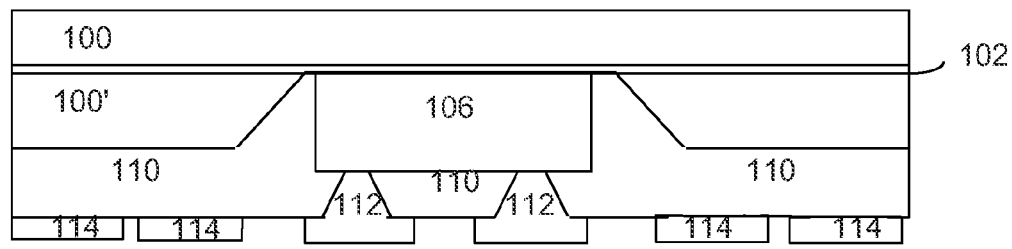
Figure 1F:
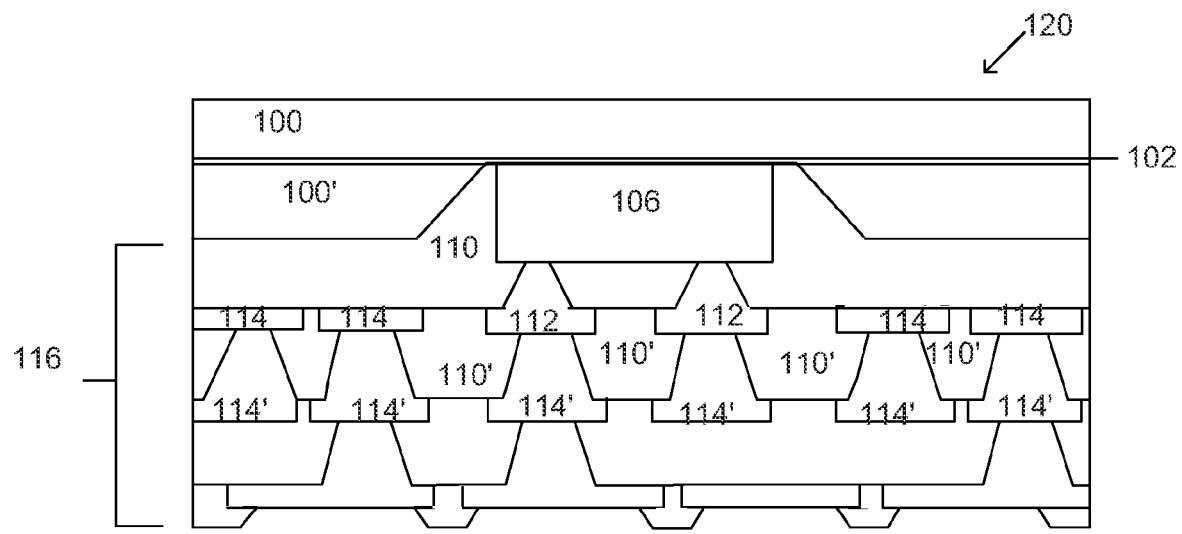

A dielectric material 110 may be formed on the carrier material 100' and adjacent the die 106 that is in the cavity 104 of the carrier material 100' (FIG. 1d). In an embodiment, the dielectric material 110 may be formed by a laminating process, for example. The dielectric material 110 may be formed on the bottom portion 101 of the cavity 104, on the angled portion 105 of the cavity 104, and on a portion of the top portion 107 of the cavity 104 of the carrier material 100' that surrounds the die 106. The dielectric material 110 may provide a level plane for a subsequent build-up process. In an embodiment, the carrier material 100' may be roughened prior to lamination to aid with adhesion to the dielectric material 110.

In an embodiment, vias may be formed in the dielectric material 112 in a die area landing of the die, wherein die pads, for example copper die pads, maybe exposed on the active side 112 of the die 106. In an embodiment, a semi-additive process (SAP) may be used to form die pad interconnect structures 112 on die pads of the die 106 and a first metal layer 114 may be formed on the dielectric material 110 adjacent the die 106. Subsequent layers may then be formed using standard substrate SAP build-up processing, for example, wherein further dielectric layers 110' and metallization layers 114' may be formed upon each other to form a coreless substrate portion 116 of a coreless package structure 120 by utilizing the buildup process (FIG. 10. In an embodiment, the coreless package structure 120 may comprise a BBUL coreless package structure 120.

Figure 1G:
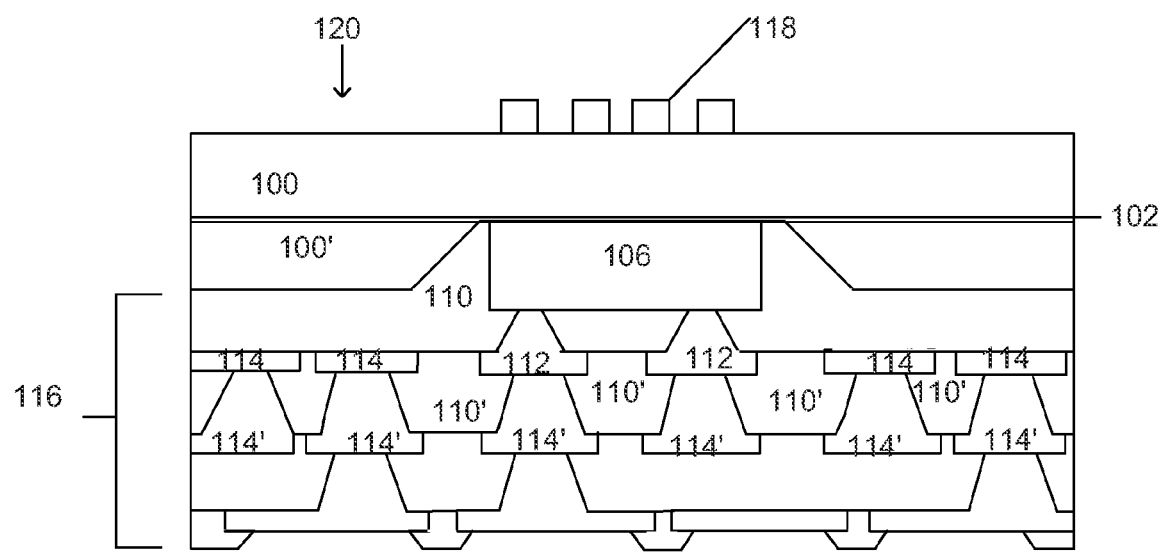
Figure 1H:
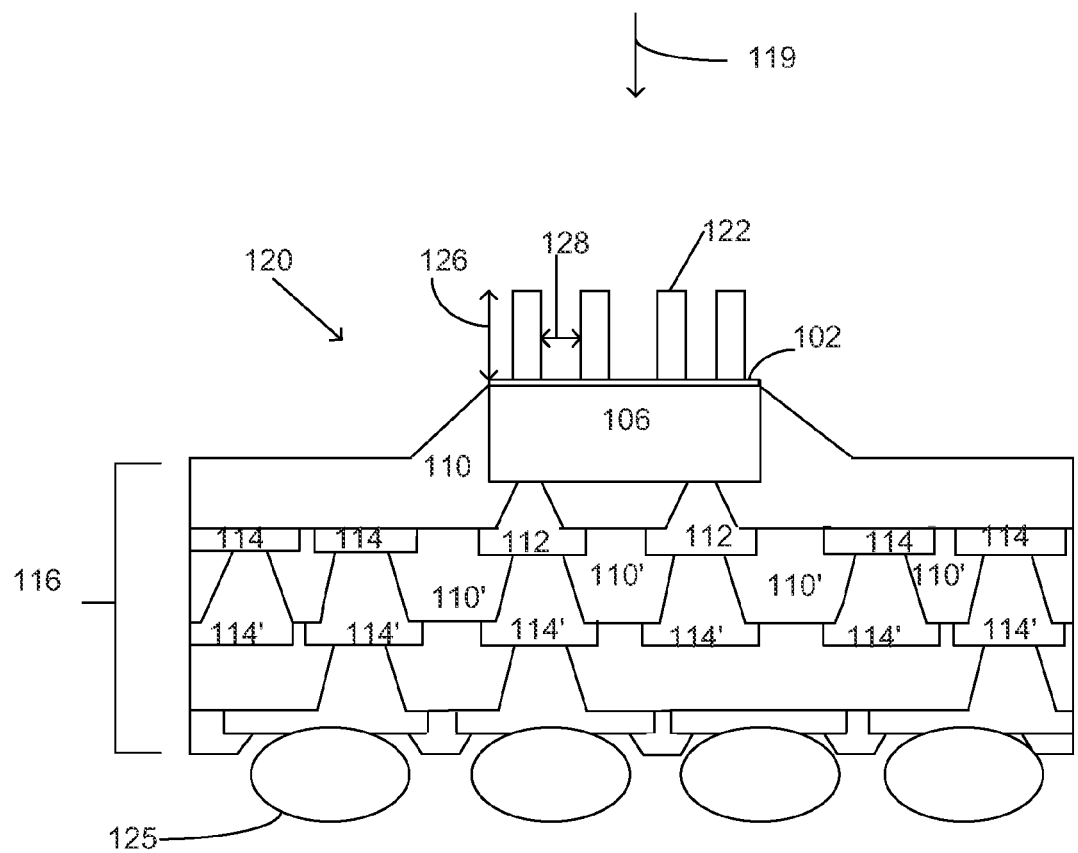

In an embodiment, a patterning material 118, such as a dielectric material/resist material, may be formed on the carrier material 100 (FIG. 1g). For example, a dry film may be laminated and then patterned on the top layer of the carrier material 100, and then subtractive etching/removal processing may be done to form a micro-feature structure 122 that comprises a portion of the carrier material 100 and the etch stop layer 102 (FIG. 1h). Thus, the micro-feature structure 122 is formed in-situ directly on the die 106 from the carrier material 100 of the coreless package structure 120. The coreless package substrate 120 may further comprise interconnect structures 125, such as ball gird array (BGA) balls, that may be attached to the package structure 120. In an embodiment, the micro-feature structure 122 may comprise a height 126 and a gap 128 between adjacent micro-feature structures 122, and may comprise a heat spreader 122, for example.

Figure 1I:
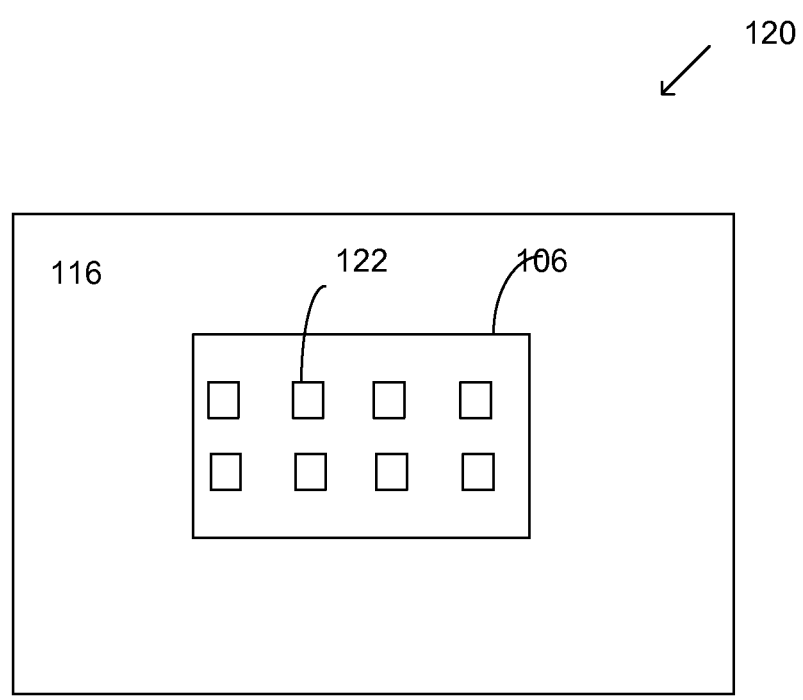
Figure 1J:
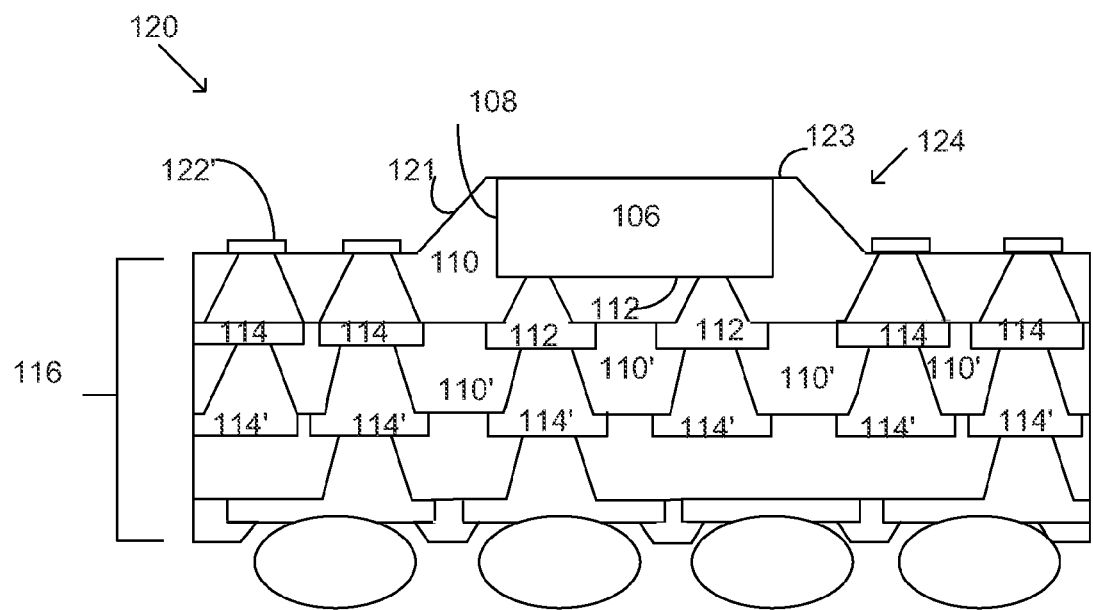

In an embodiment, the microelectronic feature structures 122 that may be pattered and formed from the carrier material may include such structures as a heat spreader (as depicted in FIG. 1h), Package on Package (POP) land structures 122', as depicted in FIG. 1j, and inductor structures, for example. In some cases, the inductor structures and the PoP land structures may be formed in non-die regions on a top surface of the coreless package structure 120, and the inductor structures and the PoP land structures may comprise the same material as the micro-feature structure/heat spreader, since they are all formed from the carrier material. Since the micro-feature structure 122 is formed at the panel level, the throughput of the embodiments presented herein is much faster than for prior art processes which attach micro-electronic heat spreaders, for example, after the package is manufactured. FIG. 1i depicts a top view of the coreless package structure 120 of FIG. 1i, wherein the micro-feature structure 122 is formed in situ from the carrier material on the die 106.

Figure 1K:
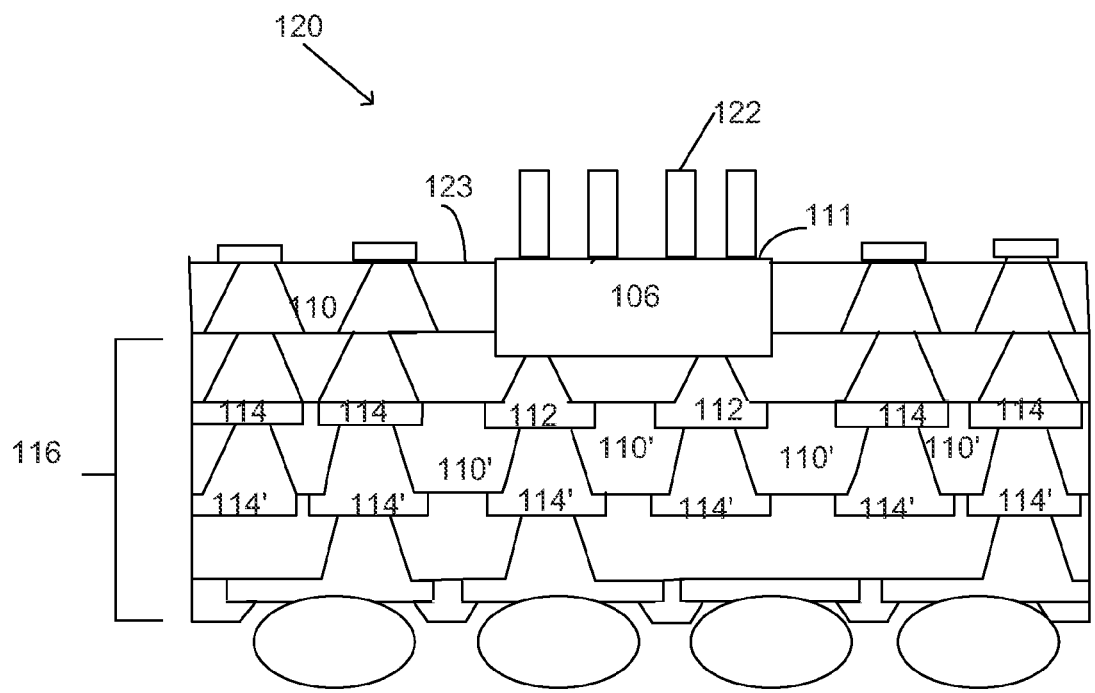

In an embodiment, the coreless package structure 120 may comprise a fillet structure 124 of dielectric material 110 around the die 106, wherein the dielectric material 110 may surround the sidewall 108 and the bottom 112 of the die 104, but wherein the dielectric material 110 is absent on the back side 111 of the die 106 (FIG. 1j). The fillet structure 124 may comprise an angled portion 121 of the dielectric 110 that may be angled/raised in relation to a planar top portion 123 of the dielectric 110. The geometry of this fillet structure 124 can be optimized to provide maximum reliability of the die/package. In an embodiment, the die 106 may be partially embedded into the coreless substrate 116. In another embodiment, the die 106 may be initially disposed on the flat portion of the material 100 (referring back to FIG. 1a), and may not be formed in a cavity (FIG. 1k). In some embodiments, the backside 111 of the die 106 may be substantially coplanar with the top portion 123 of the dielectric 110.

Benefits of the embodiments enable a new packaging architecture that can meet design requirements for future mobile/handheld system on a chip (SoC) processors at roughly half the cost of current package architectures. Various embodiments makes use of processes such as dry film lamination, patterning and subtractive etching to provide a solution for making a micro-channel based cooling solution, for example, on top of the die. Various embodiments serve for the addition of a very effective heat spreader by patterning part of the carrier that would normally be etched away. Various embodiments enable patterning of a copper foil that may be part of a carrier for coreless BBUL packages. Prior art coreless BBUL packages typically target small dies (~8×8 mm) in products with low power consumption. However, there is a need to build packages with larger die and higher power consumption, where thermal cooling is expected to become a bigger problem.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that various microelectronic structures, such as package structures, are well known in the art. Therefore, the Figures provided herein illustrate only portions of an exemplary microelectronic device that pertains to the practice of the present invention. Thus the present invention is not limited to the structures described herein.

What is claimed is:

1. A method comprising;
forming a cavity in a carrier material;
attaching a die in the cavity;
forming a dielectric material adjacent the die;
forming vias in a region of the dielectric material adjacent the die;
forming vias in the die area to expose die pads on the die;
forming die pad interconnect structures in the die area; and
patterning the carrier material to form at least one micro-feature structure.

2. The method of claim 1 further comprising wherein the at least one micro-feature structure comprises at least one of a heat spreader, a PoP land structure, and an inductor structure.

3. The method of claim 1 further comprising wherein the die is partially embedded into the coreless substrate, and wherein the dielectric material is formed along a portion of a sidewall of the die.

4. The method of claim 1 further comprising wherein the die comprises a portion of a coreless bumpless build-up layer package.

5. The method of claim 1 wherein patterning the carrier material comprises patterning the carrier material while the carrier material is disposed on the die.

6. The method of claim 1 further comprising wherein the carrier material comprises a first layer and a second layer separated by an etch stop layer, and wherein the micro-feature structure comprises the carrier material disposed on the etch stop layer that is disposed on the die.

7. The method of claim 2 further comprising wherein the carrier material comprises copper.

8. The method of claim 1 further comprising wherein the die comprising the micro-feature structure comprises a portion of a coreless, bumpless, build up layer package.

9. A method comprising;
   attaching a die to a carrier material;
   forming dielectric material surrounding the die;
   forming buildup layers in the dielectric material to form a coreless bumpless buildup package structure; and
   patterning the carrier material to form micro-feature structures on the package structure.

10. Theo method of claim 9 further comprising forming die interconnect structures in the dielectric material.

11. The method of claim 9 further comprising wherein the carrier material comprises a first layer and a second layer separated by an etch top layer, wherein the first layer is removed, and the second layer that is disposed on the etch stop layer that is disposed on the die is patterned to form a heat spreader.

12. The method of claim 9 wherein the carrier material comprises a multi-layer separated by an etch stop layer.

13. The method of claim 9 further comprising wherein carrier material is patterned to form at least one of a PoP land structure and an inductor structure in a non-die region of the package structure.

* * * * *